United States Patent
Kanno et al.

(10) Patent No.: US 7,432,735 B2
(45) Date of Patent: Oct. 7, 2008

(54) PROGRAMMABLE GATE ARRAY APPARATUS AND METHOD FOR SWITCHING CIRCUITS

(75) Inventors: Shinichi Kanno, Kawasaki (JP);
Toshikatsu Hida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/874,981

(22) Filed: Oct. 19, 2007

(65) Prior Publication Data
US 2008/0048718 A1    Feb. 28, 2008

Related U.S. Application Data

(62) Division of application No. 11/387,872, filed on Mar. 24, 2006, now Pat. No. 7,301,369.

(30) Foreign Application Priority Data
Sep. 6, 2005    (JP)    ............................. 2005-258113

(51) Int. Cl.
*H03K 19/173* (2006.01)
*H03K 19/177* (2006.01)

(52) U.S. Cl. ............................. 326/41; 326/38; 326/39; 326/40; 326/47

(58) Field of Classification Search ............. 326/37–41, 326/47, 101
See application file for complete search history.

(56) References Cited

U.S. PATENT DOCUMENTS

| | | | | |
|---|---|---|---|---|
| 6,483,343 | B1 * | 11/2002 | Faith et al. | 326/40 |
| 7,161,384 | B1 * | 1/2007 | Lin et al. | 326/41 |
| 7,301,369 | B2 * | 11/2007 | Kanno et al. | 326/41 |

FOREIGN PATENT DOCUMENTS

JP    11-317659    11/1999

\* cited by examiner

*Primary Examiner*—Rexford Barnie
*Assistant Examiner*—Thienvu V Tran
(74) *Attorney, Agent, or Firm*—Oblon, Spivak, McClelland, Maier & Neustadt, P.C.

(57) ABSTRACT

A programmable gate array apparatus includes macrocells connected in series, each macrocell including first group of storage elements in which active context data item is stored and second group of storage elements corresponding to storage elements of first group respectively, in which idle context data item is stored, connects storage elements of second group in series, loads context data item into second group whose storage elements are connected in series, connects first group and second group by connecting storage elements of first group to corresponding storage elements of second group respectively, and swaps context data items between first group and second group.

8 Claims, 14 Drawing Sheets

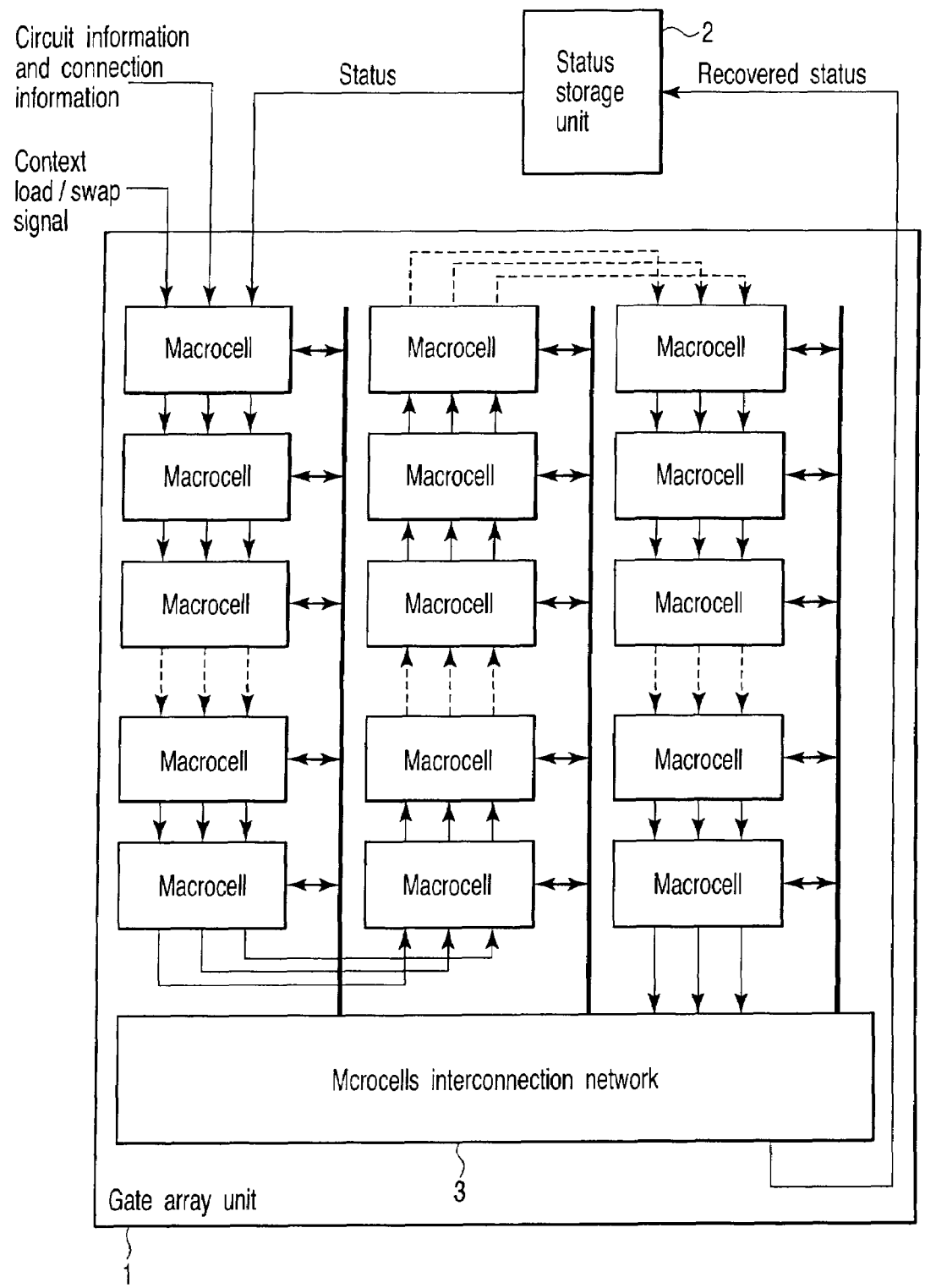
F I G. 3

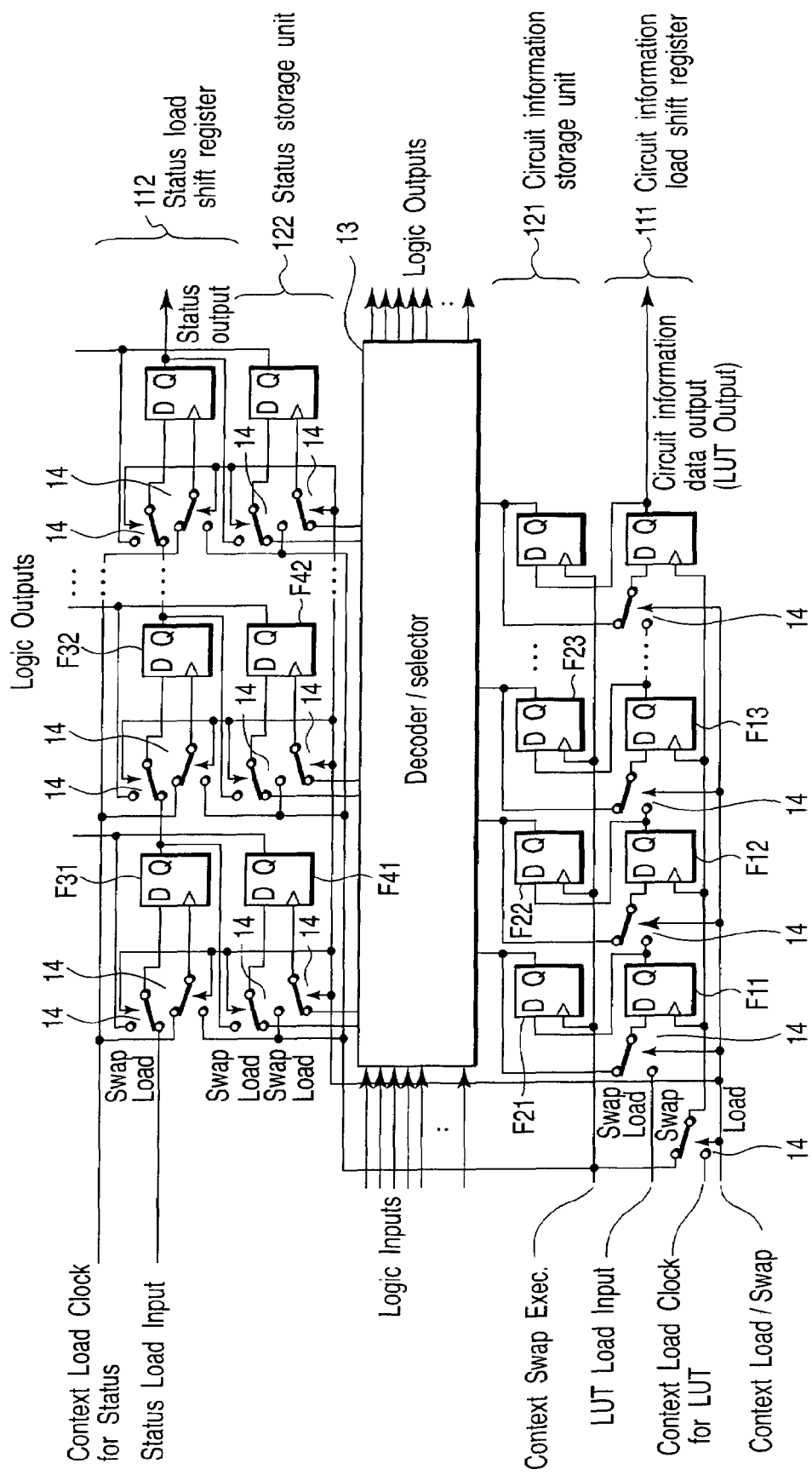
F I G. 5

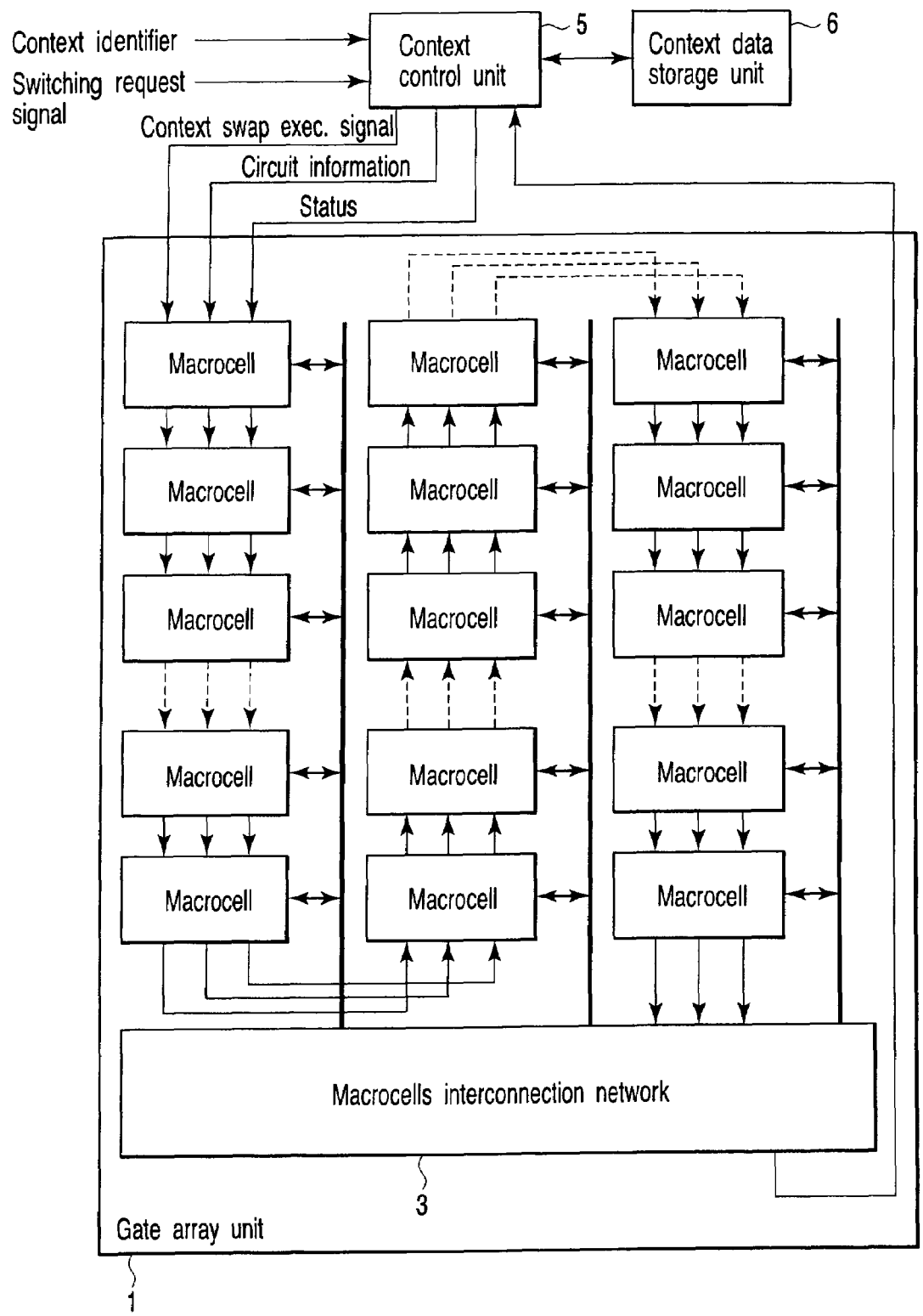
F I G. 9

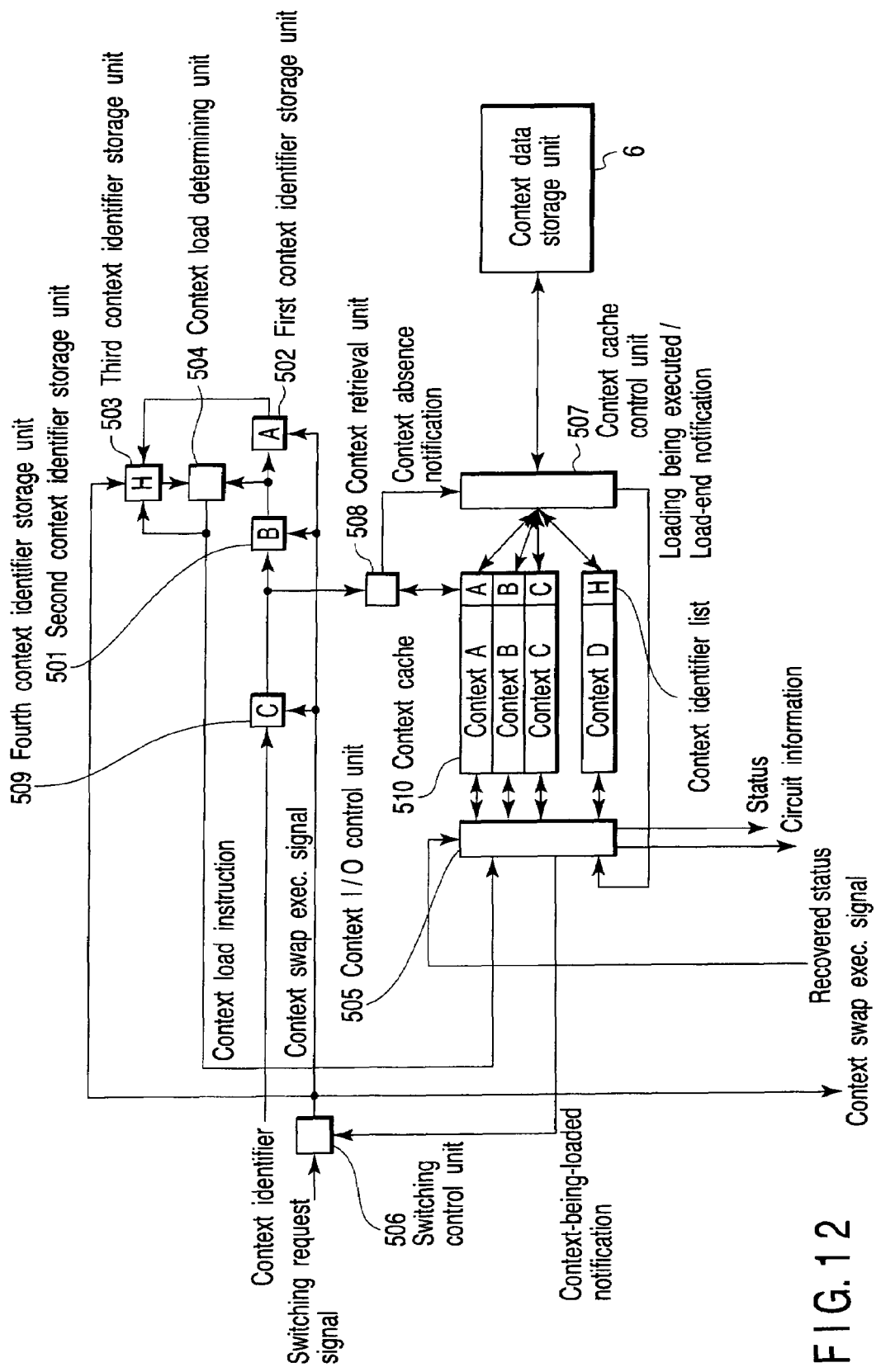
F I G. 12

PROGRAMMABLE GATE ARRAY APPARATUS AND METHOD FOR SWITCHING CIRCUITS

CROSS-REFERENCE TO RELATED APPLICATIONS

This application is a divisional of U.S. application Ser. No. 11/387,872 filed on Mar. 24, 2006, now U.S. Pat. No. 7,301,369 and is based upon and claims the benefit of priority from prior Japanese Patent Application No. 2005-258113, filed Sep. 6, 2005, the entire contents of each of which are incorporated herein by reference.

BACKGROUND OF THE INVENTION

1. Field of the Invention

The present invention relates to a programmable gate array apparatus.

2. Description of the Related Art

FIG. 1 shows an example of a programmable gate array that inputs circuit information that dynamically determines operations of a circuit, to a lookup table (LUT) that determines a large number of circuit operations, a set of storage elements (hereinafter referred to as macrocells) that store outputs from the lookup table, and a programmable interconnection network (macrocells interconnection network) that connects the macrocells together.

Here, the following are collectively called context data: the circuit information stored in the LUT and determining the operations of the programmable gate array, the initial states of the storage elements storing outputs from LUT, and connection information on the interconnection network.

The circuit requires a large amount of context data because context data must be individually loaded into all macro cells mounted in the programmable gate array. A large number of macrocells are also mounted in the circuit so that layout of signal lines individually identifying the macrocells results in an increase in the size of the circuit. The context data is thus loaded by cascading the macrocells as shown in FIG. 2 and sequentially transferring the data among the macrocells.

On the other hand, this method requires a relatively long time to load the context data. Stopping the operation of the gate array during this period reduces the effective operation time and processing ability of the gate array.

Storage elements into which context data is loaded are thus provided separately from LUT. Once the storage elements are filled with context data, the data is transferred in parallel from the storage elements to LUT. This enables the stop time to be significantly reduced.

However, this method requires the programmable gate array to contain the storage elements that do not relate directly to the operations. As a result, a large part of the circuit mounted in the gate array is disadvantageously ineffectively utilized.

Cascading the macrocells enables a reduction in the number of wires required to distribute context data. However, the sequential transmission requires data to be loaded into macrocells not involved in the operations.

It has been proposed that the circuit information items in the programmable gate array (hereinafter also referred to as context data items) be dynamically replaced with one another and switched in a time division manner to equivalently implement a large-scale circuit (see, for example, Jpn. Pat. Appln. KOKAI Publication No. 11-317659).

However, since the circuit information has a large amount of data, a large overhead associated with the circuit switching may result from simple loading of the circuit information item into the gate array as required. This may degrade the processing performance of the entire circuit.

The method of storing all the contexts in the gate array reduces the switching time itself but disadvantageously increases the circuit scale of the programmable gate array itself.

As described above, the conventional technique is disadvantageous in that if the context data items in the gate array are replaced with one another so as to allow the single gate array to implement different circuits, it is impossible to reduce the time required to switch the context data items using a small number of storage elements.

BRIEF SUMMARY OF THE INVENTION

A programmable gate array apparatus includes a plurality of macrocells connected in series; a first input unit configured to input a load signal to the macrocells; a second input unit configured to input a swap signal to the macrocells; a third input unit configured to input one of a plurality of context data items to the macrocells; a fourth input unit configured to input a clock signal to the macrocells. And each of the macrocells includes a first group of storage elements in which another of the context data items is stored as an active context data item; a second group of storage elements corresponding to the storage elements of the first group respectively, in which another of the context data items is stored as an idle context data item; a loading control unit configured to connect the storage elements of the second group in series when the load signal is input, to connect the macrocells in series via the second group in the each of the macrocells, and load, by using the clock signal, the one of the context data items into the second group whose storage elements are connected in series, to store the one of the context data items in the second group as the idle context data item; and a swapping control unit configured to connect the first group and the second group by connecting the storage elements of the first group to corresponding storage elements of the second group respectively when the swap signal is input, and swap the another of the context data items and the one of the context data items between the first group and the second group, to store the one of the context data items in the first group as the active context data item and to store the another of the context data items in the second group as the idle context data item.

BRIEF DESCRIPTION OF THE SEVERAL VIEWS OF THE DRAWING

FIG. 3 is a diagram schematically showing the configuration of a programmable gate array apparatus according to a first embodiment;

FIG. 5 is a diagram showing an example of configuration of the macrocell in further detail;

FIG. 9 is a diagram schematically showing the configuration of a programmable gate array apparatus according to a third embodiment;

FIG. 12 is a diagram showing an example of configuration of a context control unit according to a fourth embodiment;

DETAILED DESCRIPTION OF THE INVENTION

Figure 1:
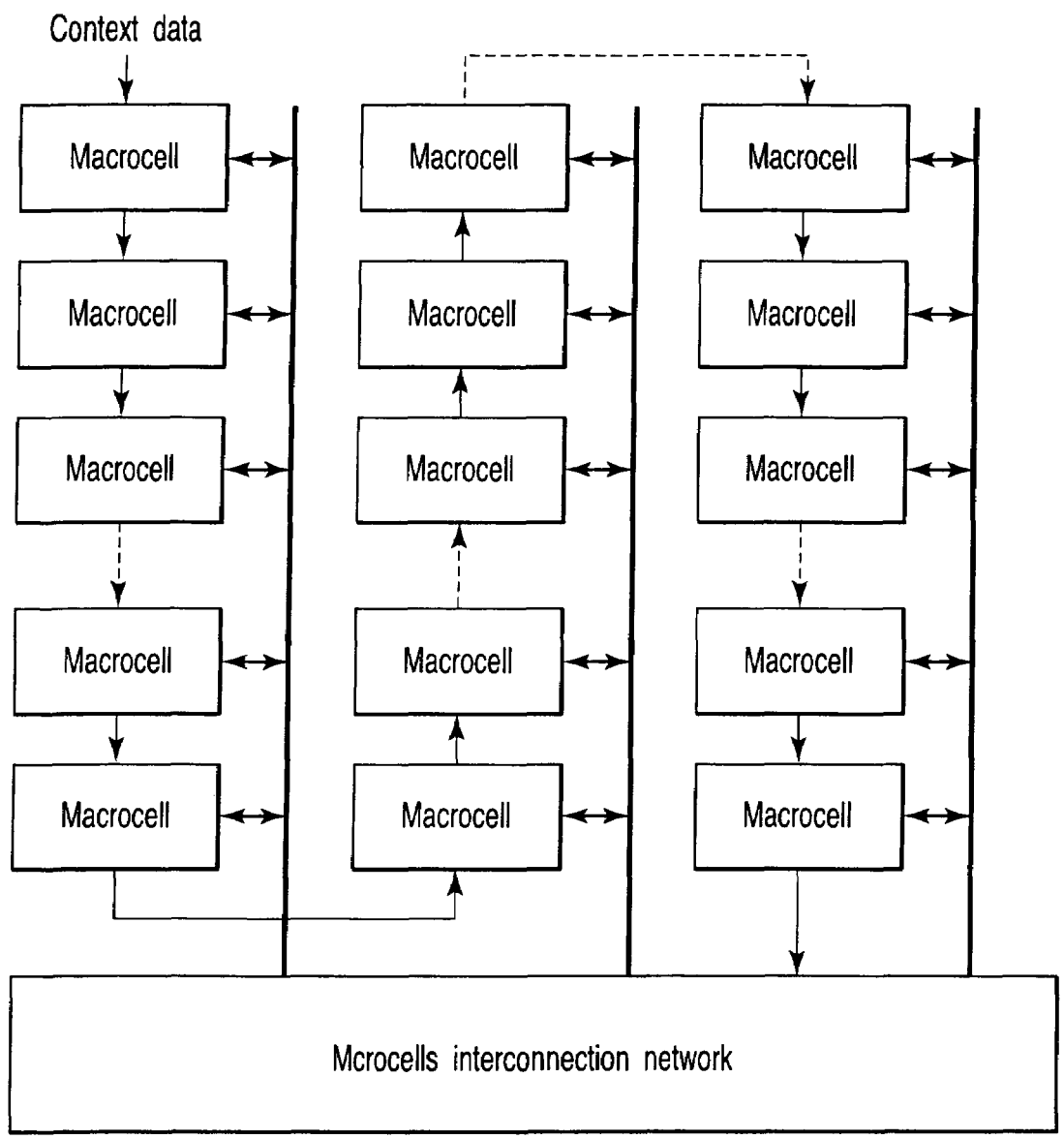
FIG. 1 is a diagram schematically showing the configuration of a conventional programmable gate array.
Figure 2:
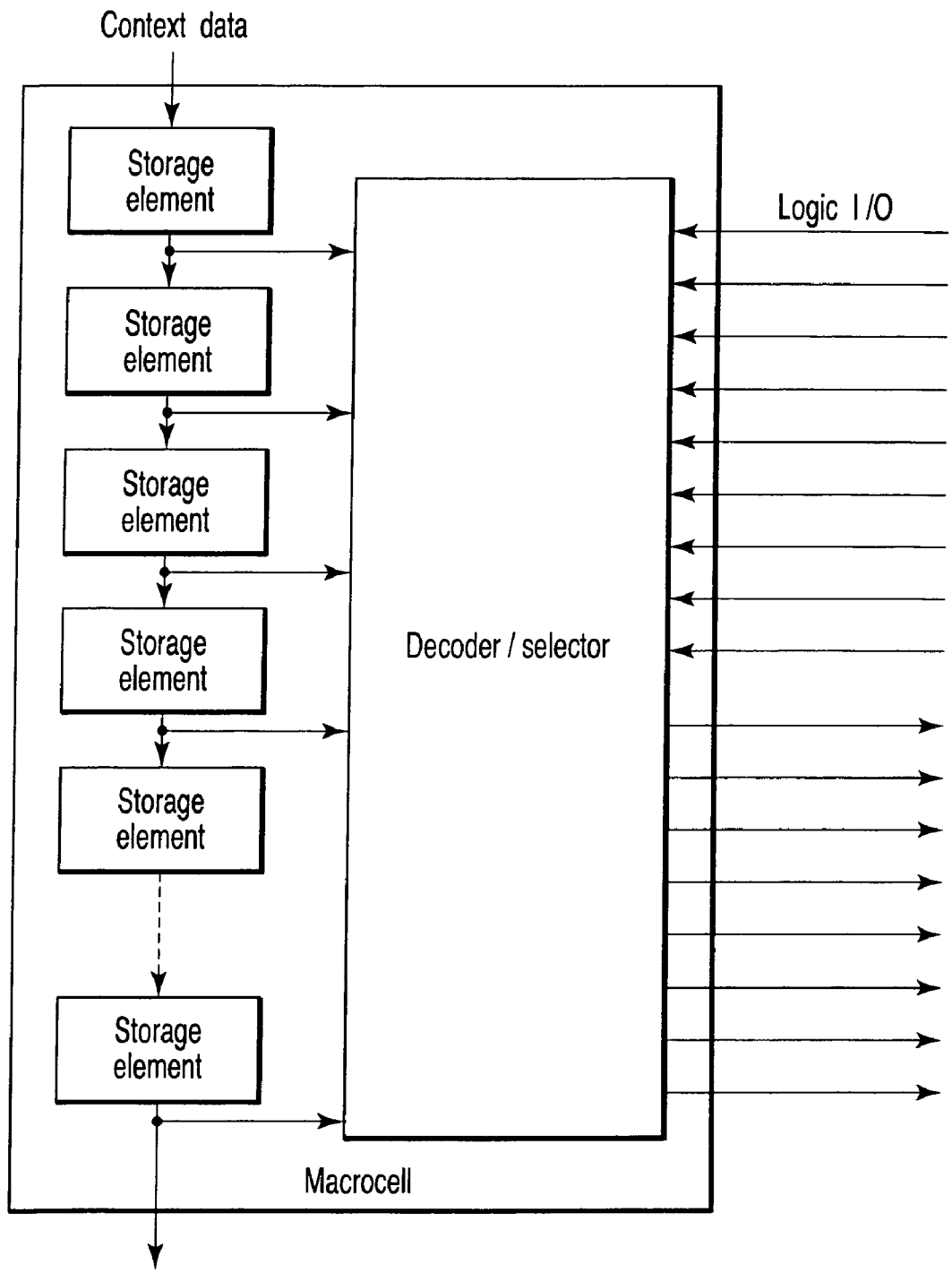
FIG. 2 is a diagram schematically showing the configuration of a macrocell in the conventional programmable gate array.

Embodiments of the present invention will be described below with reference to the drawings.

Description will be given below of an example of configuration of a gate array unit 1 and its peripheral essential parts; the gate array unit 1 is mounted in apparatuses or systems such as portable terminals such as a cellular phone and a PDA. The gate array unit 1 replaces different circuit information items with one another to realize the operations of plural types of circuits.

Here, information item required for the gate array unit 1 to perform a circuit operation determined by each circuit information item is called context data item. The context data item is a general name for circuit information item (logic data item) such as logics for a circuit implemented by each macro cell, the circuit execution state (status information item) of each macrocell obtained when the circuit information item is executed by the gate array unit 1, and connection information items on macrocells interconnection network.

First Embodiment

FIG. 3 shows an example of configuration of the gate array unit 1 and its peripheral essential parts according to the first embodiment. The gate array unit 1 performs plural types of circuit operations by replacing the circuit information items in the gate array unit 1 with one another.

The gate array unit 1 includes a plurality of macrocells connected in series and performing circuit operations (logics) determined by set (loaded) circuit information item and a programmable-macrocells-interconnection-network 3 that controls inputs and outputs for the logics of the plurality of macrocells.

The following are input to the gate array unit 1 by a control unit (not shown) of an apparatus including the gate array unit 1: circuit information item to be loaded into each macrocell, connection information item to be loaded into the macrocells-interconnection-network, and the context load/swap signal instructing of loading or swapping a context data item (including circuit information item, a status information item, and connection information item). Although not shown in FIG. 3, the following are also input to the gate array unit 1: a clock signal (context load clock for an LUT signal) used to transfer context data to the interior of the gate array unit 1, the context load clock for a status signal, and the context swap exec. signal instructing swapping to be executed.

A status information item loaded into each macrocell is read from a status storage unit 2 and input to the gate array unit 1.

A first circuit information item which is one of a plurality of circuit information items is loaded into the gate array unit 1, which then performs a circuit operation based on the first circuit information item. Subsequently, to switch (swap) from the first circuit information item that is in execution to second circuit information item, the gate array unit 1 recovers the current status information item from each macrocell and stores and saves it in the status storage unit 2 as required. Subsequently, to perform the circuit operation again on the basis of the first circuit information item, the gate array unit 1 loads the first circuit information item and the recovered status information item (stored in the status storage unit 2) into each macrocell. That is, to resume the circuit operation based on the first circuit information item, the gate array unit 1 loads, into each macrocell, the first circuit information item and the status information item corresponding to the first circuit information item stored in the status storage unit 2. If the first circuit information item and the status information item are stored in a saving area (context load shift register 11 described later), they need not be loaded but the second circuit information item has only to be switched (swapped) to the first circuit information item.

Figure 4:
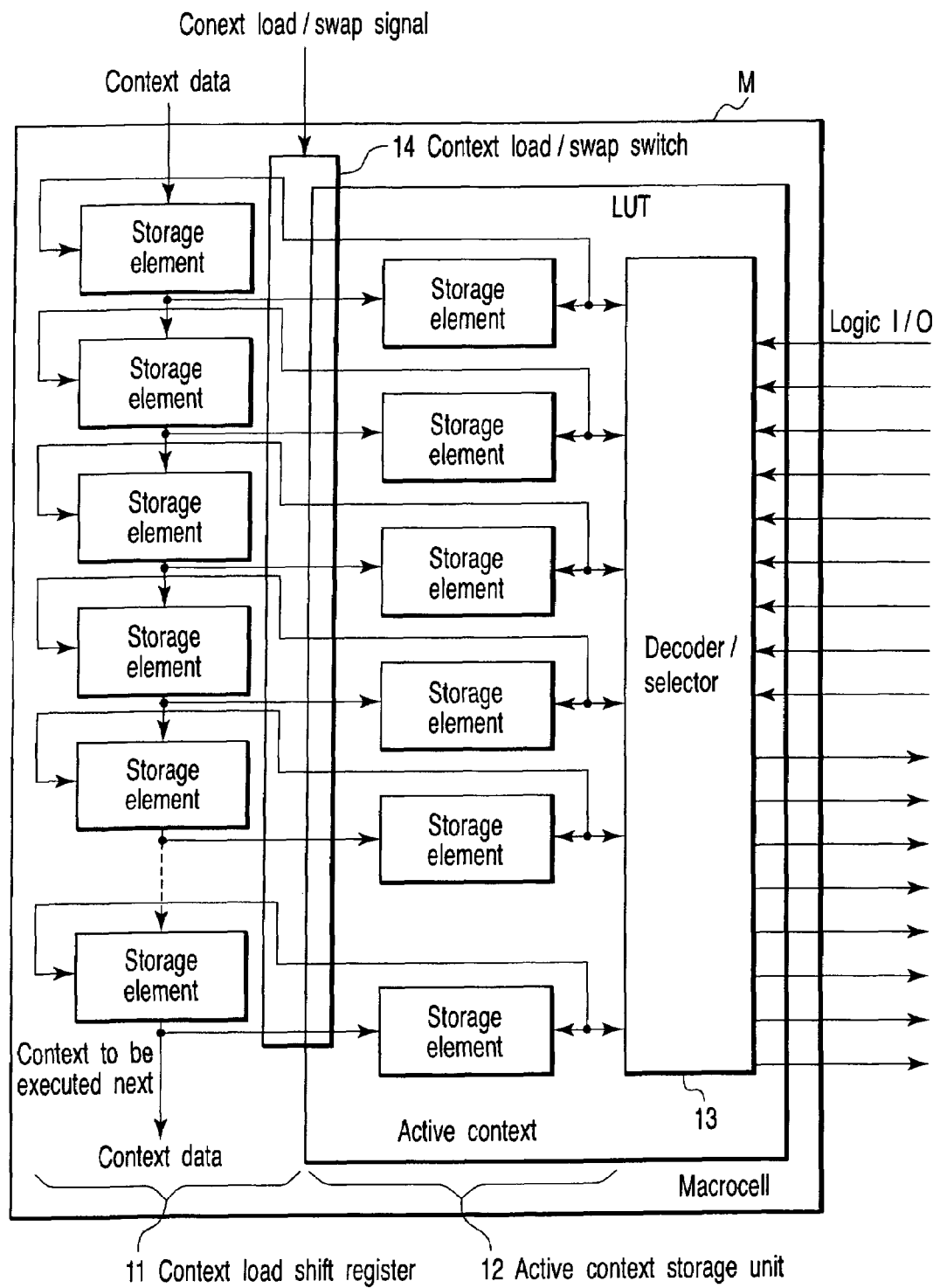
FIG. 4 is a diagram schematically showing an example of configuration of a macrocell in the programmable gate array apparatus.

FIG. 4 schematically shows an example of internal configuration of each macrocell constituting the gate array unit 1 in FIG. 1.

As shown in FIG. 4, the macrocell includes a context load shift register 11, an active context storage unit 12, a decoder/selector 13, and a switch 14. The active context storage unit 12 and the decoder/selector 13 correspond to LUT (Look Up Table).

In FIG. 4, for simplification, connection information item and status information item are collectively referred to as context data item.

The context load shift register 11 consists of a plurality of storage elements connected in series. The context load shift register 11 loads context data item such as circuit information item or a status information item into the macrocells. The context load shift register 11 stores idle context data item (including circuit information item and status information item).

The active context storage unit 12 consists of a plurality of storage elements connected to input and output terminals of the decoder/selector 13. The active context storage unit 12 stores active context data item (including circuit information item and status information item).

When the context load/swap signal being input indicates "load", the context load/swap switch 14 make the context load shift register 11 transfer context data item among the macrocells. When the context load/swap signal being input indicates "swap" the context load/swap switch 14 make the context load shift register 11 and the active context storage unit 12 swap context data item stored in the active context storage unit 12 (the context data item that is in execution by the gate array unit 1) for context data item stored (loaded) in the context load shift register 11.

In response to a logic input, the decoder/selector 13 operates in accordance with the circuit information item stored in the active context storage unit 12 to output a result (logic output).

In such a configuration, while the macrocell is executing the context data item, the context load shift register 11 is used to load another context data item to be executed next. The context data item being loaded is swapped with the active context data item stored in the active context storage unit 12.

FIG. 5 shows the configuration of the macrocell shown in FIG. 4, in further detail.

In FIG. 5, the context load shift register 11 in FIG. 4 is divided into a circuit information load shift register 111 into which circuit information item and connection information item are loaded and a status load shift register 112 into which status information item is loaded.

The active context storage unit 12 in FIG. 4 is divided into a circuit information storage unit 121 that stores circuit information item that is in execution (active circuit information item) and a status storage unit 122 that stores the status information item of the context data item that is in execution (active context data item).

The circuit information storage unit 121 consists of a plurality of flip flop circuits each having a data output terminal connected to the corresponding input terminal of the decoder/selector 13.

The circuit information load shift register 111 consists of a plurality of flip flop circuits corresponding to the respective flip flop circuits of the circuit information storage unit 121. In the group of flip flop circuits arranged in line in the circuit information load shift register 111, the following are connected together via the load/swap switches 14: a data output terminal of a preceding flip flop circuit (for example, a flip flop circuit F12), a data input terminal of a succeeding flip flop circuit (for example, a flip flop circuit F13), and a data output terminal of the flip flop circuit (for example, a flip flop circuit F23) which is in the circuit information storage unit 121 and corresponds to the succeeding flip flop circuit.

The data output terminal of each flip flop circuit (for example, a flip flop circuit F12) in the circuit information load shift register 111 is also connected to a data input terminal of the flip flop circuit (for example, a flip flop circuit F22) which is in the circuit information storage unit 121 and corresponds to the above flip flop circuit in the circuit information load shift register 111.

The data output terminal ("circuit information data output") of the final flip flop circuit in the circuit information load shift register 111 is connected via the load/swap switch 14 to the data input terminal of the first flip flop circuit (flip flop circuit F11) in the circuit information load shift register 111 in the next macrocell.

To load circuit information item into the macrocell, the context load/swap signal instructing a "load" is input, the load/swap switches 14 are set to the load side. In each macrocell, this connects the data input terminal and data output terminal of each flip flop circuit in the circuit information load shift register 111 to the data output terminal of the preceding flip flop circuit and the data input terminal of the succeeding flip flop, respectively. The group of flip flop circuits in the circuit information load shift register 111 is thus connected together in series. The data output terminal of the final flip flop circuit in the circuit information load shift register 111 in each macrocell is connected directly to the data input terminal of the first flip flop circuit in the circuit information load shift register 111 in the next macrocell. This disconnects the circuit information load shift register 111 from the circuit information storage unit 121 in each macrocell. The circuit information load shift registers 111 in a plurality of macrocells are connected in series. Under these conditions, context data item input to the gate array unit 1 is sequentially transferred to all the macrocells in accordance with the context load clock for an LUT signal by the circuit information load shift register 111.

The context load/swap signal instructing a "swap" is input, the load/swap switches 14 are set to the swap side. The data output terminal of each flip flop circuit (for example, the flip flop circuit F22) in the circuit information storage unit 121 is then connected to the input terminal of the flip flop circuit (for example, the flip flop circuit F12) which is in the circuit information load shift register 111 and corresponds to the above flip flop circuit in the circuit information storage unit 121. The output terminal of each flip flop circuit (for example, the flip flop circuit F11) in the circuit information load shift register 111 is disconnected from the input terminal of the succeeding flip flop circuit (for example, the flip flop circuit F12) and connected to the input terminal of a flip flop circuit (for example, a flip flop circuit F21) in the circuit information storage unit 121.

Under these conditions, the context swap exc. signal is input, the circuit information item in the circuit information storage unit 121 to be replaced with the circuit information item stored in the circuit information load shift register 111.

This configuration enables the following operations to be simultaneously performed so that circuit information items can be replaced with each other substantially without stopping the macrocell or restraining the stop time of the macrocells: the operation of loading new context data item from the circuit information load shift register 111 into the circuit information storage unit 121 of LUT and the operation of saving circuit information item being executed from the circuit information storage unit 121 to the circuit information load shift register 111.

Subsequently, to re-execute the circuit information item saved to the circuit information load shift register 111, the context load/swap signal indicating "swap" is first input as described above while omitting the procedure of loading circuit information item into the circuit information load shift register 111. The context swap exec. signal is subsequently input to replace the circuit information stored in the circuit information storage unit 121 with the circuit information saved in the circuit information load shift register 111.

The input side of LUT, that is, swapping of circuit information, has been described above. However, the above description also applies to the output side of LUT, that is, swapping of status.

Now, the swapping of status will be described with reference to FIG. 5.

The status storage unit 122 storing status information item output by LUT consists of a plurality of flip flop circuits. The data input terminal of each flip flop circuit is connected to the output terminals of the decoder/selector 13 via the respective load/swap switches 14.

The status load shift register 112 consists of a plurality of flip flop circuits corresponding to the respective flip flop circuits of the status storage unit 122. In the group of flip flop circuits arranged in line in the status load shift register 112, the following are connected together via the load/swap switches 14: a data output terminal of a preceding flip flop circuit (for example, a flip flop circuit F31), a data input terminal of a succeeding flip flop circuit (for example, a flip flop circuit F32), and a data output terminal of the flip flop circuit (for example, a flip flop circuit F42) that is in the status storage unit 122 and corresponds to the succeeding flip flop circuit.

The data input terminal of each flip flop circuit (for example, a flip flop circuit F42) in the status storage unit 122 is connected to a data output terminal of the flip flop circuit (for example, the flip flop circuit F32) that is in the status load shift register 112 and corresponds to the above flip flop circuit in the status storage unit 122 and is connected to the output terminals of the decoder/selector 13 via the respective load/swap switches 14.

The data output terminal ("status input") of the final flip flop circuit in the status load shift register 112 is connected via the load/swap switch 14 to the data input terminal of the first flip flop circuit (flip flop circuit F31) in the status load shift register 112 in the next macrocell.

To load a status information item into the macrocell, the context load/swap signal instructing "load" is input, the load/swap switches 14 are set to the load side. This connects the data input terminal and data output terminal of each flip flop circuit in the status load shift register 112 to the data output terminal of the preceding flip flop circuit and the data input terminal of the succeeding flip flop, respectively. The group of flip flop circuits in the status load shift register 112 is thus connected together in series. The data output terminal of the final flip flop circuit in the status load shift register 112 in each macrocell is connected to the data input terminal of the first flip flop circuit in the status load shift register 112 in the next macrocell. This disconnects the status load shift register 112 from the status storage unit 122. The status load shift registers 112 in a plurality of macrocells are connected together in series. Under these conditions, a status information item being input to the gate array unit 1 is sequentially transferred to all the macrocells in accordance with a context load clock for a status signal by the status load shift register 112.

The context load/swap signal instructing "swap" is input, the load/swap switches 14 are set to the swap side. The data output terminal of each flip flop circuit (for example, the flip flop circuit F32) in the status load shift register 112 is connected to the input terminal of the flip flop circuit (for example, the flip flop circuit F42) that is in the status storage unit 122 and corresponds to the above flip flop circuit in the status load shift register 112. The input terminal of each flip flop circuit (for example, the flip flop circuit F32) in the status load shift register 112 is disconnected from the output terminal of the preceding flip flop circuit and connected to the output terminal of the flip flop circuit (for example, the flip flop circuit F42) in the status storage unit 122.

Under these conditions, when the context swap exc. signal is input, the status information item (of the active context) stored in the status storage unit 122 is replaced with the status information item (of another context) stored in the status load shift register 112.

This configuration enables the following operations to be simultaneously performed so that contexts can be replaced with each other substantially without stopping the macrocell or restraining the stop time: the operation of loading a new status information item from the status load shift register 112 into the status storage unit 122 and the operation of saving status of context being executed from the status storage unit 122 to the status load shift register 112.

When the context swap exec. signal is input after the context load/swap signal indicating "swap", the swapping of circuit information items and status information item is executed at a time as described above, thus swapping contexts with each other.

To execute the former context after the context swapping, the status information item is restored similarly to the circuit information item as described below. To restore the status information item saved to the status shift register 112, the context load/swap signal indicating "swap" is first input as described above while omitting the procedure of loading a status information item into the status shift register 112. The context swap exec. signal is subsequently input to replace the status stored in the status storage unit 122 with the status information item of another context stored in the status load shift register 112.

If the context saved to the status load shift register 112 as a result of the context swapping is not the context to be executed next, it must be recovered in order to load a new context to be executed next time. The recovered status is stored in the status storage unit 2. In this case, after the context load/swap signal instructing "load" is input, the status in the status load shift register 112 is sequentially transferred among a plurality of macrocells in accordance with the context load clock for a status signal and then stored in the status storage unit 2.

The swapping of circuit information items and status information items associated with the swapping of contexts is described above. This description also applies to the swapping of connection information items on the macrocells-interconnection-network associated with the swapping of contexts.

In the first embodiment, one data line is used to load circuit information items or a status information item. However, the present invention is not limited to this. A plurality of data lines may be used to perform operations corresponding to the data lines in parallel. This makes it possible to reduce the time required to load circuit information item or a status information item.

As described above, according to the first embodiment, the plurality of storage elements (context load shift register 11) corresponding to the respective storage elements (active context storage unit 12) storing active context data item are provided. Then, while the context data item stored in the active context storage unit 12 in the lookup table is being executed, another context to be executed next is transferred to and loaded into the gate array unit 1 using the context load shift register 11. This makes it possible to substantially reduce the time required to switch the contexts while minimizing the number of storage elements inside the gate array.

Second Embodiment

Figure 6:
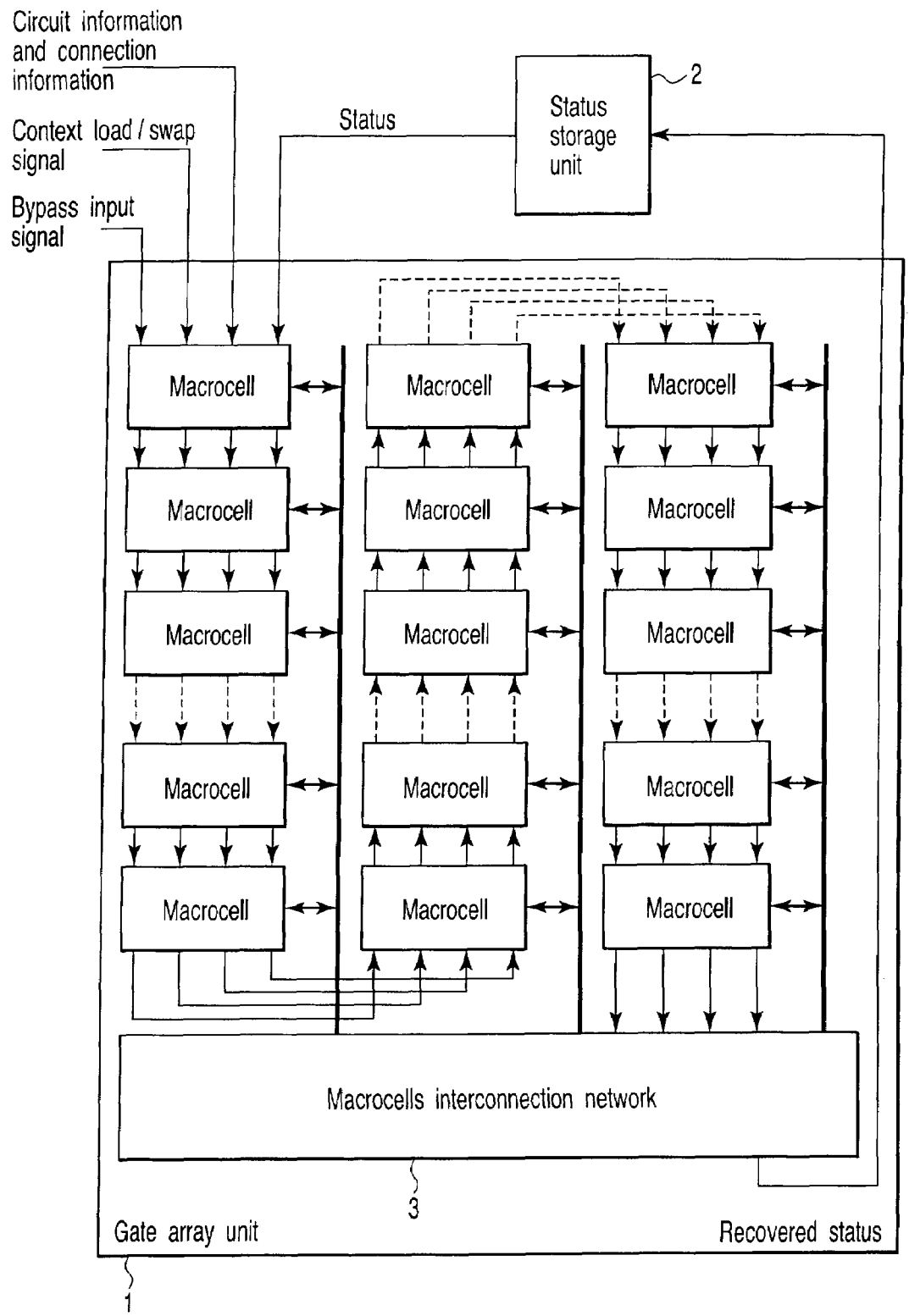
FIG. 6 is a diagram schematically showing the configuration of a programmable gate array apparatus according to a second embodiment.

FIG. 6 shows an example of configuration of the gate array unit 1 and its peripheral essential parts in accordance with a second embodiment. This embodiment uses the gate array unit 1 in FIG. 3 to perform a plurality of circuit operations by replacing different circuit information items with one another. In FIG. 6, the same components as those in FIG. 1 are denoted by the same reference numerals only the components different from those in FIG. 1 will be described.

The following are input to the gate array unit 1 shown in FIG. 6 by the control unit (not shown) of the apparatus including the gate array unit 1: circuit information item to be loaded into each macrocell, connection information item to be loaded into the macrocells-interconnection-network, the context load/swap signal instructing context data (such as circuit information item, a status information item, and connection information item) to be loaded or swapped, and a bypass input signal.

As shown in FIG. 6, in the gate array unit 1, paths through which context data item is transferred to the corresponding macrocells are connected in series.

Not all the macrocells provided in the gate array unit 1 may be used depending on circuit information item loaded into the gate array unit 1.

In this case, when loading context data such as circuit information item or a status information item, the gate array unit 1 according to the second embodiment bypasses macrocells which do not require loading of contexts. This also applies to the recovery of the status information item; macrocells which do not require recovery of the status are bypassed.

Figure 7:
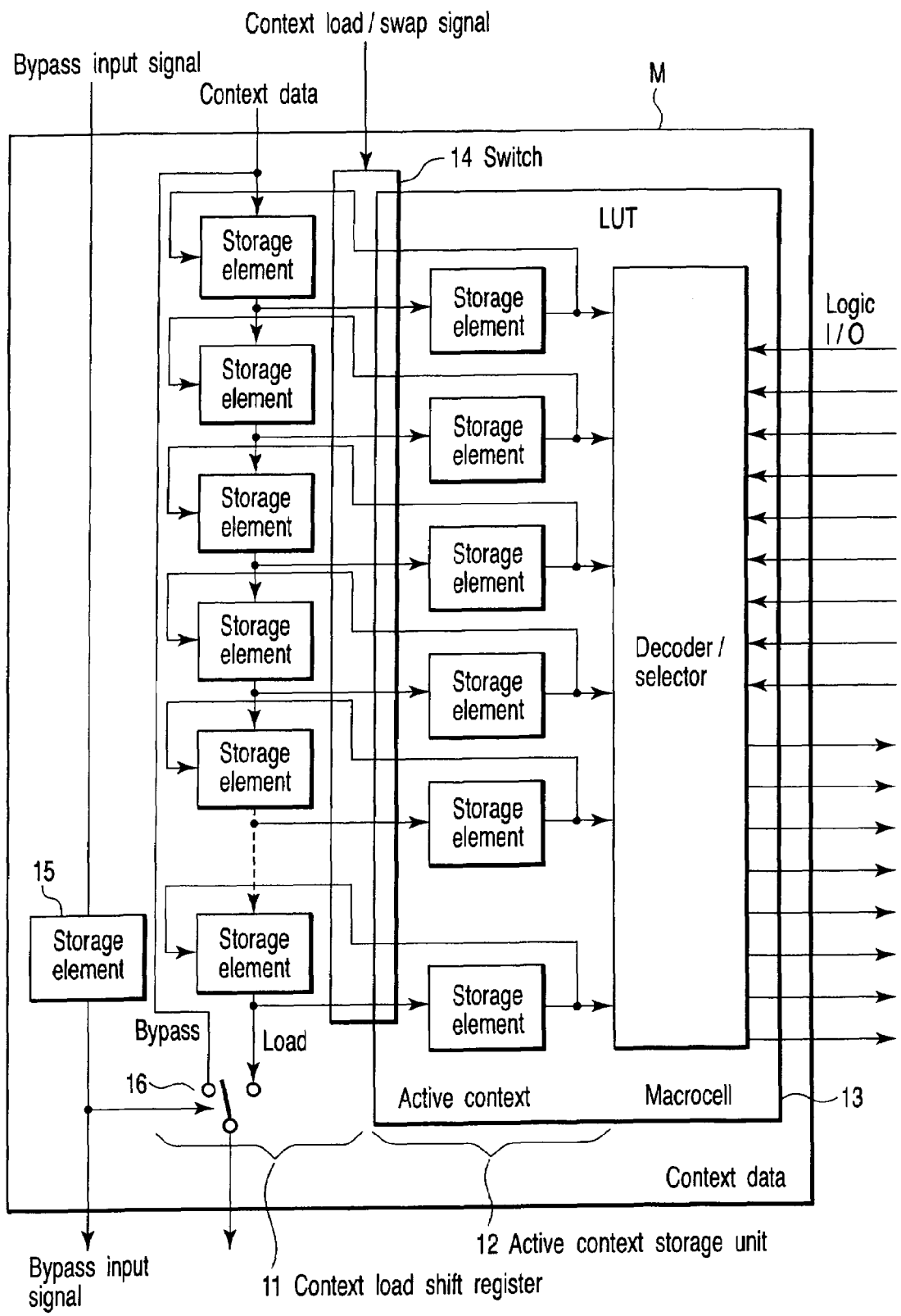
FIG. 7 is a diagram schematically showing an example of configuration of a macrocell in the programmable gate array apparatus.

FIG. 7 schematically shows an example of internal configuration of each of the macrocells constituting the gate array unit 1 according to the second embodiment. In FIG. 7, the same components as those in FIG. 4 are denoted by the same reference numerals. Only the components different from those in FIG. 1 will be described.

The macrocell in FIG. 7 further comprises a storage element 15 storing bypass control information item indicating whether or not to use the macrocell (whether or not to load context data item or to recover the status information item) and a switch 16 that set the macrocell bypass-state or not-bypass-state on the basis of bypass control information item stored in the storage element 15.

Unnecessary macrocells are preset for each context. Thus, for each context, bypass information items indicating whether or not to use each macrocell is stored in the storage element 15. The bypass control information item for each macrocell is stored in the storage element 15 in that macrocell by transferring the information item among the macrocells connected in series, as in the case of context data item.

It is only necessary to be able to determine whether or not to use each macrocell, on the basis of the bypass control information item for each macrocell. The storage element 15 storing the bypass information item has a very small data capacity. The data capacity may be, for example, 1 bit.

If the storage element 15 in a macrocell stores bypass control information item for the macrocell indicating that the macrocell is "not to be used", that is, the macrocell is "to be bypassed", the switch 16 in the macrocell is set to the bypass side. Context data item being input to the macrocell is output from the macrocell as it is (without passing through the context load shift register 11) and then input to the next macrocell.

If the storage element 15 in the macrocell stores bypass control information item for the macrocell indicating that the macrocell is "to be used", that is, the macrocell is "not to be bypassed", the switch 16 in the macrocell is set to the load side. Context data being input to the macrocell passing through the context load shift register 11 and is then loaded into the next macrocell.

The context data item is loaded into the macrocell as follows. First, before transfer of the context data item, a bypass input signal is input. The bypass input signal being input is sequentially transferred to the next macrocell through the storage element 15 which is provided in the macrocell and consist of a flip flop circuit. The bypass control information item for the macrocell is then stored in the storage element 15 in the macrocell.

Once the bypass control information item for the macrocell is stored in the storage element 15, the switch 16 is set to the bypass or load side. The context data item is then input.

If the switch 16 is set to the bypass side, the circuit information item being input to the macrocell is output from the macrocell via the switch 16 as it is. The circuit information item is then transferred to the next macrocell. The status information item being input to the macrocell is output from the macrocell via the switch 16 as it is. The status information item is then transferred to the next macrocell.

If the switch 16 is set to the load side, an operation similar to that described in the first embodiment is performed.

To recover the status from the macrocell, an operation is performed which is similar to the operation of the loading of contexts described above. That is, before recovery of the status, a bypass input signal is input. The bypass control information item for the macrocell is then stored in the storage element 15. The switch 16 is then set to the bypass or load side on the basis of the bypass control information item.

If the switch 16 is set to the bypass side, the macrocell is disconnected from the status recovery line as shown in FIG. 7. Consequently, even if the context load clock for a status signal is subsequently input to recover the status (even if the recovery of the status is started), the status is not recovered from the macrocell.

If the switch 16 is set to the load side, then as in the case of the first embodiment, when the context load clock for a status signal is input to recover the status (the recovery of the status is started), the status is recovered from the macrocell. The status information item is then stored in the status storage unit 2.

When context data item starts to be loaded, the status saved to the status shift register 112 starts to be transferred for recovery. Accordingly, if not all the macrocells need to have their bypass control information item changed for status recovery (the bypass control information item on each macrocell required for status recovery is the same as that required for context data loading), bypass control information item need not be separately input for context data loading and for status recovery. For example, bypass input signal that can be used both for context data loading and for status recovery may be input when context data loading.

This also applies to the connection information item on the macrocells-interconnection-network 3.

As described above, for each context, bypass control information item corresponding to each macrocell is used to control whether or not to bypass the macrocell during context data loading or during status recovery.

As described in the first embodiment, with the configuration shown in FIG. 7, while a macrocell is executing a certain context, another context is loaded into the context load shift register 11 in the macrocell. The active context stored in the active context storage unit 12 is then replaced with the context stored in the context load shift register 11 at a time in accordance with the context swap exec. signal.

Thus, first bypass control information item and second bypass control information item are stored in the storage element 15: the first bypass control information item corresponds to the active context and the second bypass control information item is used to load the next context to be executed next.

If, while executing one context, a macrocell loads another context to be executed next the one context, a bypass input signal is input to the gate array unit 1 before loading of the context data item to be executed next; the following are input into the macrocell in accordance with the bypass input signal: the first bypass control information item for the active context and the second bypass control information item used to load the context to be executed next.

The bypass input signal is input to the gate array unit 1 by the control unit of the apparatus including the gate array unit 1.

The storage element 15 includes a first storage element 15*a* that stores the first bypass control information item and a second storage element 15*b* that stores the second bypass control information item.

To swap contexts in accordance with the context swap exec. signal, the first bypass control information item and second bypass control information item are replaced with each other between the storage elements 15*a* and 15*b*.

Figure 8:
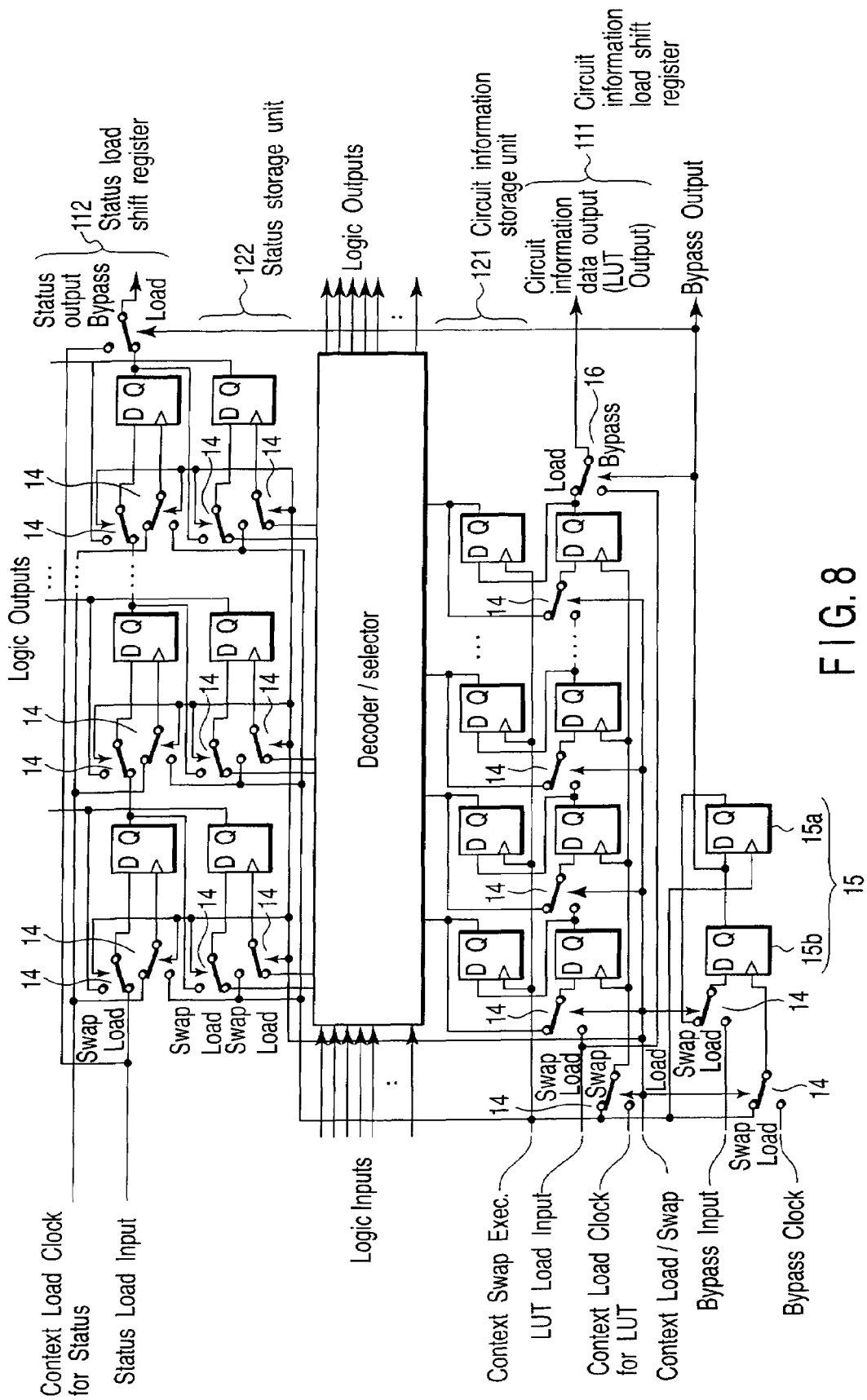
FIG. 8 is a diagram showing an example of configuration of the macrocell in further detail.

FIG. 8 shows the configuration of the macrocell shown in FIG. 7, in further detail. In FIG. 8, each macrocell uses the above two bypass control information items. In FIG. 8, the same components as those in FIG. 5 are denoted by the same reference numerals. Only the components different from those in FIG. 5 will be described. That is, the macrocell shown in FIG. 8 comprises the storage elements 15a and 15b; when the context load/swap signal indicates "load", before loading of the context data item to be executed next, the bypass input signal is transferred, which loads the first bypass control information item corresponding to the active context and the second bypass control information item corresponding to the context data item to be executed next, and the first and second bypass control information items for the macrocell is then stored in the storage elements 15a and 15b. The storage elements 15a and 15b consist of flip flop circuits.

The storage element 15a in each macrocell stores the first bypass control information item for the macrocell. The storage element 15b stores the second bypass control information item for the macrocell.

The macrocell in FIG. 8 comprises a switch 16 that set the macrocell bypass-state if the bypass control information item stored in the storage element 15b indicates that the macrocell is "not to be used", that is, it is "to be bypassed".

Context data item (in FIG. 8, circuit information item and a status information item) is loaded into the macrocell as described below. First, the bypass input signal is input before transfer of the context data item to be executed next. The input bypass input signal is transmitted to the next macrocell through the storage element 15 which is provided in each macrocell and consists of two flip flop circuits. Once the first and second bypass control information items for the macrocell are stored in the storage elements 15a and 15b, respectively, the switch 16 is set to the bypass side or load side based on the bypass control information item stored in the storage element 15b. Context data is then input.

If the switch 16 is set to the bypass side, the circuit information load shift register 111 is disconnected from the circuit information transfer line. The status load shift register 112 is disconnected from the status transfer line. Circuit information item being input to the macrocell is thus output from the macrocell via the switch 16 as it is. The circuit information item is then input to the next macrocell. A status information item being input to the macrocell is output from the macrocell via the switch 16 as it is. The status information item is then input to the next macrocell.

If the switch 16 is set to the load side, an operation is performed which is similar to that described in the first embodiment.

The completion of transfer of the circuit information item and status information item of the context to be executed next results in storing the circuit information item and status information item corresponding to the macrocell in the circuit information load shift register 111 and status load shift register 112, respectively, in each macrocell used for the context to be executed next.

When the context load/swap signal indicating "swap" is input, the switch 14 is set to the "swap" side. In accordance with the context swap exec. signal, the active context (circuit information item and status information item) is replaced with the next context to be executed (circuit information item and status information item) between the circuit information storage unit 121 and the circuit information load shift register 111 and between the status storage unit 122 and the status load shift register 112. At the same time, the first bypass control information item corresponding to the active context is replaced with the second bypass control information item corresponding to the context to be executed next, between the first storage element 15a and the second storage element 15b.

As a result, the first bypass control information item is stored in the second storage element 15b. The second bypass control information item is stored in the first storage element 15a.

To execute the former context again after context swapping, the circuit information item and status information item are restored, which have been saved to the circuit information load shift register 111 and status load shift register 112, respectively. The bypass control information items are also replaced with each other between the first storage elements 15a and 15b.

Description will be given of the case where the status information item of the saved former context is recovered after context swapping. Once the contexts are swapped with each other as described above, the second storage element 15b stores the first bypass control information item for the former context. This causes the switch 16 to be set to the bypass/load side on the basis of the first bypass control information item.

That is, context swapping results in setting the switch 16 in each of the macrocells which are not used for the former context, to the bypass side. The macrocell is thus disconnected from the status recovery line. The switch 16 in each of the macrocells which are used for the former context are set to the load side.

When the context load clock for a status signal is input to recover the status information item of the former context (when the recovery of the status is started), the status information item is not recovered from the macrocells bypassed on the basis of the first bypass control information item. In contrast, the status information item is transferred from each of the macrocells which are used for the former context, in accordance with the context load clock for a status signal. The status information item being recovered is stored in the status storage unit 2.

When context data starts to be loaded, the status information item saved to the status load shift register 112 starts to be transferred for recovery. Accordingly, if the bypass control information item for status recovery need not be changed to the bypass control information item for context data loading for all the macrocells (the bypass control information item for status recovery is the same as that for context data loading for each macrocell), the second bypass control information item for the context to be executed next is used to recover the status information item of the context saved to the status load shift register 112.

This also applies to the connection information item on the macrocells-interconnection-network 3.

In the second embodiment, one data line is used to load circuit information item or status information item. However, the present invention is not limited to this. A plurality of data lines may be used to perform operations corresponding to the data lines in parallel. This makes it possible to reduce the time required to load circuit information or status information item.

As described above, according to the second embodiment, while the gate array unit 1 is executing one context, a different context to be executed next time is transferred and loaded into the gate array unit 1. On this occasion, the macrocells which are not used for the different context are bypassed. This makes it possible to reduce the time required to transfer context.

Third Embodiment

Now, description will be given of a control method used to supply context data item to the gate array unit 1 described in the first and second embodiments.

As previously described, context data item includes circuit information data item which is to be provided to the gate array unit 1 and status information item which is to be stored in the flip flop circuits (status storage unit 122) in each macrocell and has its value updated in association with the operation of the circuit implemented in the gate array unit 1 based on the circuit information item.

FIG. 9 shows an example of configuration of the gate array unit 1 and its peripheral essential parts according to the third embodiment. This figure shows the configuration corresponding to the gate array unit 1 described in the first embodiment. However, this configuration is also applicable to the gate array unit 1 described in the second embodiment. In FIG. 9, the same components as those in FIG. 3 are denoted by the same reference numerals.

To implement a method of controlling the supply of context data item according to the third embodiment, the configuration in FIG. 9 has a newly added context control unit 5 and a context storage unit 6 to store context data item such as D-RAM provided instead of the status storage unit 2 in FIG. 3.

The context control unit 5 is provided with a context identifier of a context to be executed, by a scheduler (not shown) included in the control unit of the apparatus which includes the gate array unit 1. Then, the context control unit 5 acquires context data item corresponding to the context identifier from the context data storage unit 6 and provides it to the gate array unit 1. The context control unit 5 recovers context data item executed by the gate array unit 1 and stores it in the context data storage unit 6.

The context data item including circuit information item and status information item which are used in the gate array unit 1 and connection information item to be loaded into the macrocells-interconnection-network is stored in the context storage unit 6.

The context identifier of context data item to be loaded into each macrocell and a switching request signal are input to the context control unit 5 of the gate array unit 1 by the control unit (not shown) of the apparatus including the gate array unit 1. Although not shown in FIG. 3, the following are also input to the context control unit 5: the clock signal (context load clock for an LUT signal) which is for transferring context data item to the interior of the gate array unit 1 and the status clock signal for a status signal.

Figure 10:
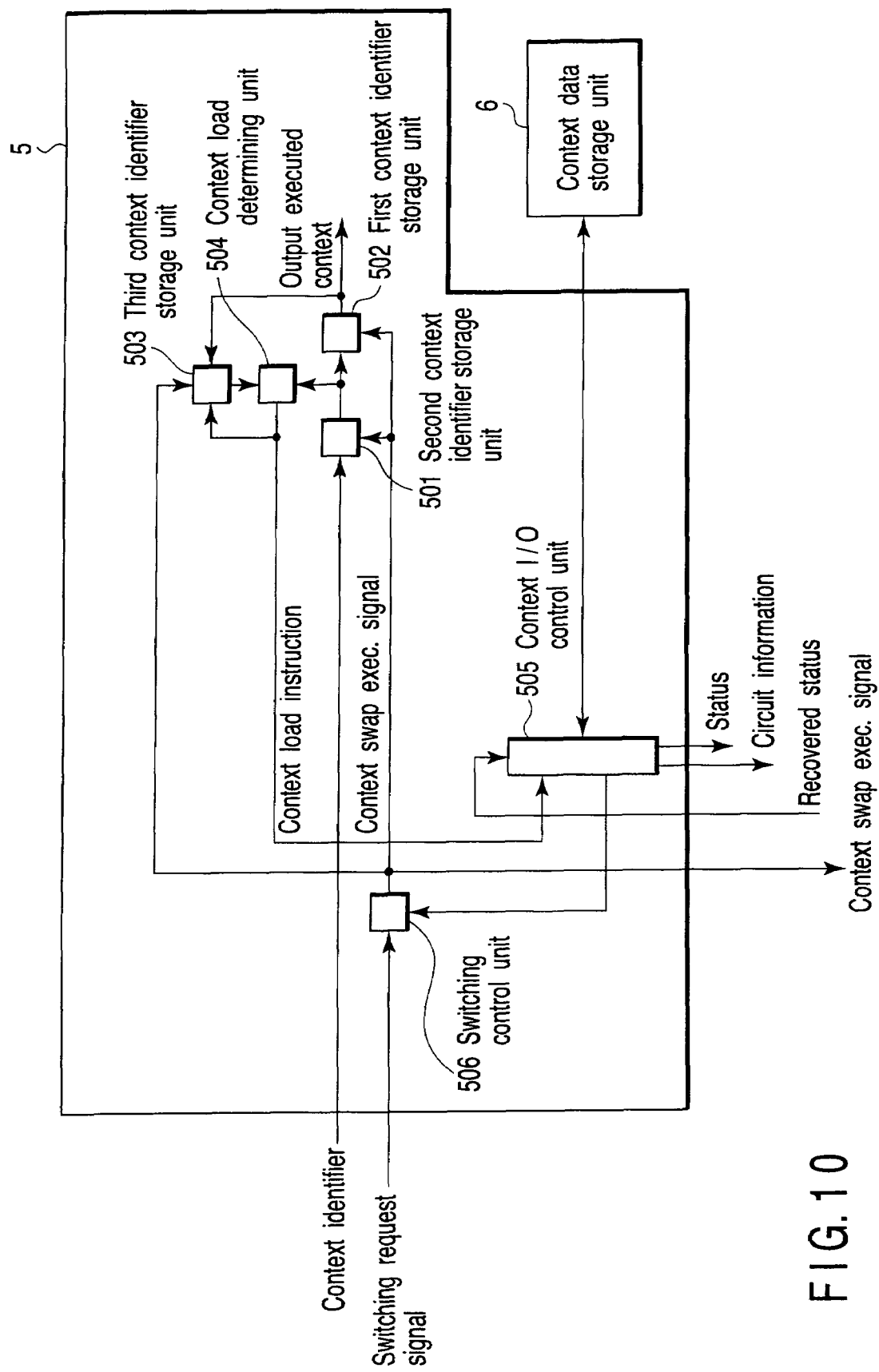
FIG. 10 is a diagram showing an example of configuration of a context control unit in FIG. 9.

FIG. 10 shows an example of configuration of the context control unit 5.

A context identifier output by the control unit of the apparatus including the gate array unit 1 is first stored in a second context identifier storage unit 501. The context identifier is then stored in a first context identifier storage unit 502, when the context swap exec. signal is input. The context corresponding to the context identifier stored in the first context identifier storage unit 502 is currently executed in the gate array unit 1.

The context data items in the gate array unit 1 are swapped with one another with the context swap exec. signal. That is, as described in the first and second embodiments, the context data item which have stored in the context load shift register 11 of the gate array unit 1 is stored in the active context storage unit 12. In contrast, the context data item which have stored in the active context storage unit 12 is stored in the context load shift register 11.

When the swapping has been executed by the context swap exec. signal, the context identifier corresponding to the context data item stored in the active context storage unit 12 is stored in the first context identifier storage unit 502. When swapping has been executed by the context swap exec. signal, the context identifier corresponding to the context data stored in the context load shift register 11 is stored in a third context identifier storage unit 503. The context identifier of the context to be executed next to the context data item (active context data item) stored in the active context storage unit 12 is stored in the second context identifier storage unit 501.

Figure 11:
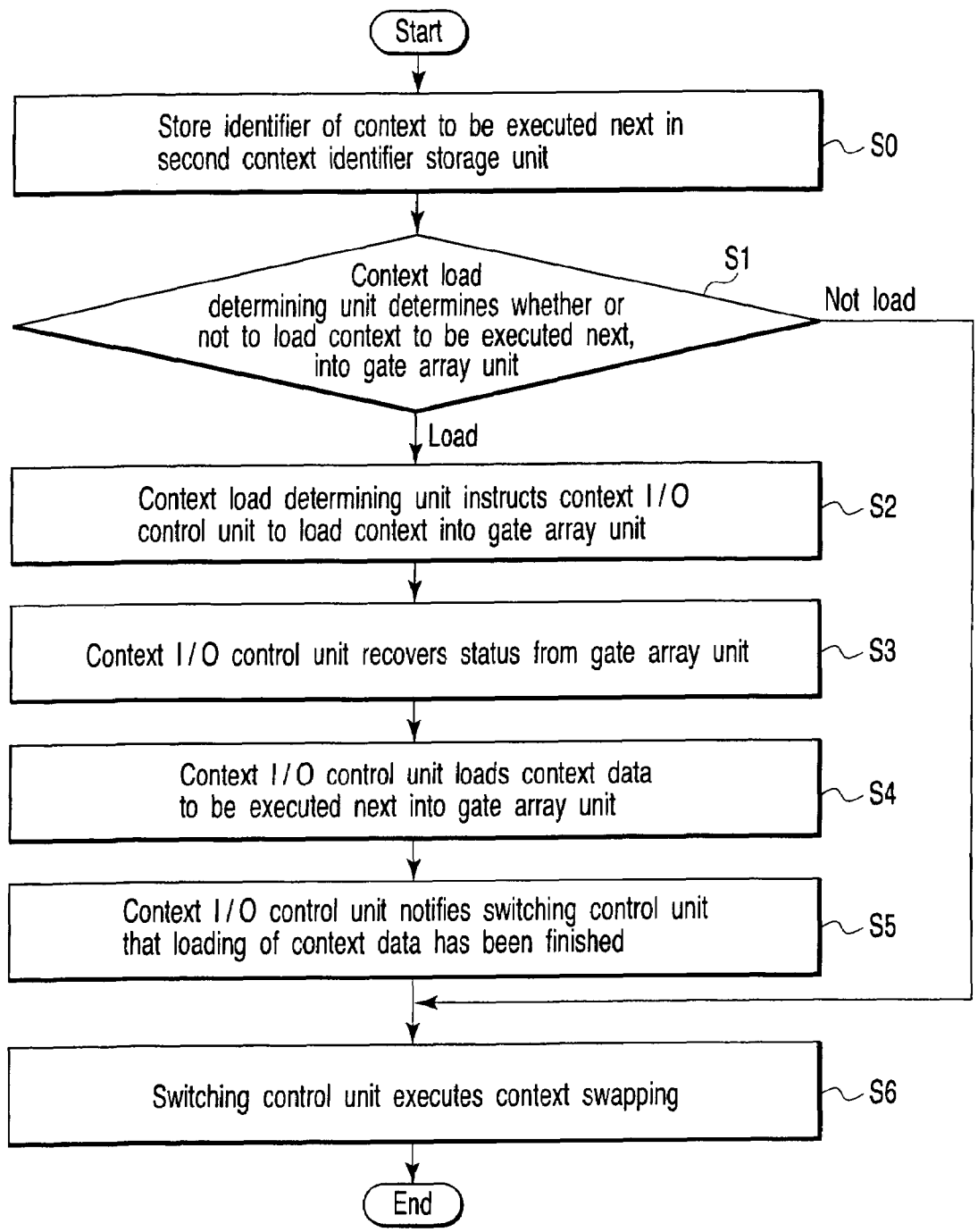
FIG. 11 is a flowchart illustrating processing operations of the context control unit in FIG. 10.

With reference to the flowchart shown in FIG. 11, description will be given of processing operations of the context control unit 5 under these conditions.

Step S0: By the context swap exec. signal, the context identifier of the context to be executed next is stored in the second context identifier storage unit 501; the context identifier has been provided by the scheduler (not shown) included in the control unit of the apparatus which includes the gate array unit 1.

Step S1: a context load determining unit 504 compares the context identifier stored in the second context identifier storage unit 501 with the context identifier stored in the third context identifier storage unit 503 to determine whether or not to load, into the gate array unit 1, the context corresponding to the context identifier stored in the second context identifier storage unit 501.

When the context identifier stored in the second context identifier storage unit 501 matches the context identifier stored in the third context identifier storage unit 503, the context load determining unit 504 determines that the context data corresponding to the context identifier stored in the second context identifier storage unit 501 be not loaded into the gate array unit 1 because it is already stored (saved) in the context load shift register 11. In this case, the context load determining unit 504 notifies a context I/O control unit 505 that no contexts data item needs to be loaded into the gate array unit 1. The process then proceeds to step S6.

Step S2: when the context identifier stored in the second context identifier storage unit 501 does not match the context identifier stored in the third context identifier storage unit 503, the context load determining unit 504 determines that the context corresponding to the context identifier stored in the second context identifier storage unit 501 be loaded into the gate array unit 1. The context load determining unit 504 then rewrites the context identifier stored in the third context identifier storage unit 503 with the context identifier currently stored in the second context identifier storage unit 501. Then, the context load determining unit 504 also instructs the context I/O control unit 505 to transfer, to the gate array unit 1, the context data item corresponding to the context identifier stored in the second context identifier storage unit 501 (the context load determining unit 504 outputs a context load instruction).

Step S3: upon receiving the context load instruction from the context load determining unit 504, the context I/O control unit 505 outputs to a switching control unit 506, a notification that the context data item is being loaded. The context I/O control unit 505 subsequently starts recovering the status information item of the context corresponding to the context identifier stored in the third context identifier storage unit 503, the status information item being currently stored in the status load shift register 112. The context I/O control unit 505 stores the status information item being recovered in the context data storage unit 6.

Step S4: the context I/O control unit 505 subsequently reads, from the context data storage unit 6, the context data item corresponding to the context identifier stored in the second context identifier storage unit 501. The context I/O control unit 505 then loads the context data item into the context load shift register 11 of the gate array unit 1.

If the gate array unit 1 is configured as described in the first and second embodiments, it is possible to simultaneously execute the loading of context into the gate array unit 1 and the recovery of the status.

Step S5: once the loading of the context data item is finished, the context I/O control unit 505 outputs a notification that the loading of the context is finished, to the switching control unit 506.

Step S6: the switching control unit 506 receives a signal requesting the context to be switched (switching request signal), from the control unit of the apparatus including the gate array unit 1. While the context I/O control unit 505 is loading the context, the switching control unit 506 cannot execute context swapping and thus suspends execution of the context swapping. Subsequently, upon receiving, from the context I/O control unit 505, a notification that the loading of the context has been finished; the switching control unit 506 executes the context swapping. That is, the switching control unit 506 outputs the context swap exec. signal to the gate array unit 1. If the switching control unit 506 receives the switching request signal after receiving, from the context I/O control unit 505, the notification that the loading of the context has been finished, it executes the context swapping upon the reception of the switching request signal.

If a notification that the loading of the context data is unnecessary is received in step S1, the switching control unit 506 executes context swapping upon the reception of the switching request signal.

As described above, the third embodiment can reduce the number of times that context data is loaded into the gate array unit 1.

Fourth Embodiment

FIG. 12 shows another example of configuration of the context control unit 5. The context control unit 5 shown in FIG. 12 is applicable to the gate array unit 1 described in the first and second embodiments. In FIG. 12, the same components as those in FIG. 10 are denoted by the same reference numerals.

A context identifier output by the control unit of the apparatus including the gate array unit 1 is first stored in a fourth context identifier storage unit 509. The context corresponding to the context identifier stored in the fourth context identifier storage unit 509 is to be executed after the next to the context being currently executed.

The context identifier stored in the second context identifier storage unit 501 indicates the context to be executed next to the context being currently executed. The context identifier stored in the first context identifier storage unit 502 indicates the context being currently executed (currently stored in the context storage unit 12). The context identifier stored in the third context identifier storage unit 503 indicates the context saved to the context load shift register 11.

By the context swap exec. signal, the context identifier stored in the fourth context identifier storage unit 509 is stored in the second context identifier storage unit 501, and the next new context identifier is stored in the fourth context identifier storage unit 509.

At the same time, the context identifier stored in the second context identifier storage unit 501 is stored in the first context identifier storage unit 502 and the context identifier stored in the first context identifier storage unit 502 is stored in the third context identifier storage unit 503.

Further, by the context swap exec. signal, the context data items in the gate array unit 1 are swapped with one another. As described in the first and second embodiments, the context data item stored in the context load shift register 11 of the gate array unit 1 is stored in the active context storage unit 12. In contrast, the context data item stored in the active context storage unit 12 is stored in the context load shift register 11.

A context cache 510 is a cache memory in which a context cache control unit 507 stores context data item previously read from the context data storage unit 6 as well as the context identifiers of the contexts. The context identifiers of the contexts stored in the context cache 510 are stored in the context cache 510, for example, as a context identifier list.

Figure 13:
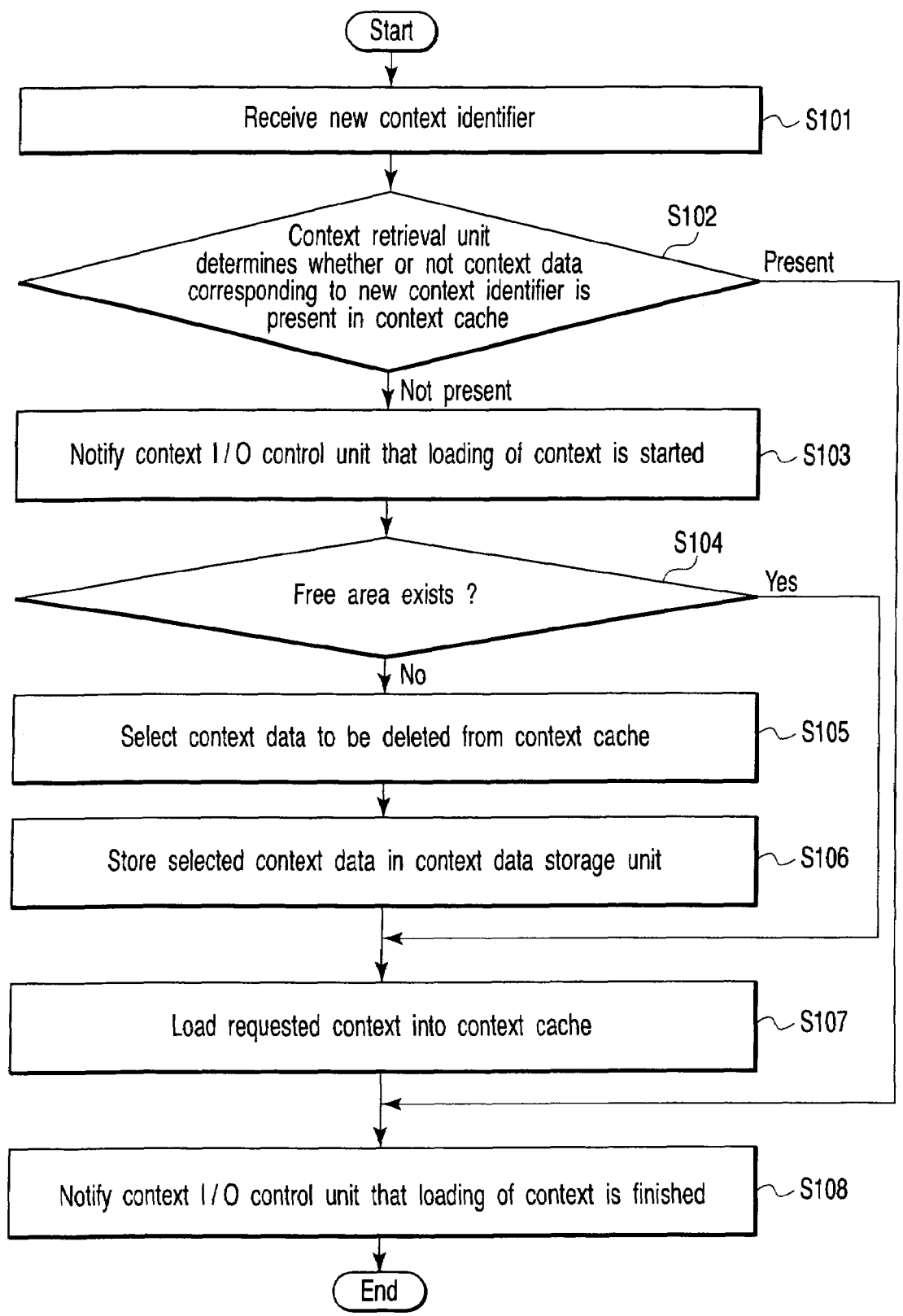
FIG. 13 is a flowchart illustrating processing operations of the context control unit in FIG. 12.

With reference to the flowchart shown in FIG. 13, description will be given of processing operations of a context retrieval unit 508 and the context cache control unit 507.

Step S101: it is assumed that a new context identifier "C" is stored in the fourth context identifier storage unit 509 with the context swap exec. signal.

Step S102: the context retrieval unit 508 refers to a context identifier list 511 stored in the context cache 510 to determine whether or not the new context identifier "C" has already been stored in the context cache 510.

When the context data item of the context identifier "C" is already stored in the context cache 510, the process proceeds to step S108 to notify the context I/O unit 505 that loading of the context data item has been finished, to finish the process. Alternatively, the process is immediately ended.

Step S103: when the context data of the context identifier "C" is not stored in the context cache 510, the context retrieval unit 508 outputs a notification indicating this, to the context cache control unit 507.

Upon receiving this notification, the context cache control unit 507 reads the context data item of the context identifier "C" from the context data storage unit 6. The context cache control unit 507 then loads the context data item into the context cache 510.

The context cache 510 has only to be able to determine from the context identifier whether or not the context is present in the context cache 510. The structure of the context cache 510 is not limited.

Step S103: when loading the context data item from the context data storage unit 6 to the context cache 510, the context cache control unit 507 notifies the context cache I/O control unit 505 that the loading is being executed.

Steps S104 and S107: in the case of loading the context data item and the context cache 510 has a free area, the context cache control unit 507 loads the context data into the free area.

Steps S104 to S107: if the context cache has no free area, the context cache control unit 507 selects, from the context data items stored in the context cache 510, one or more context data items which are to be deleted from the context cache 510 and stored in the context data storage unit 6 (step S105).

For example, if the context cache 510 stores context data item having a context identifier which is not stored in any of the first to fourth context identifier storage unit 501 to 503 and 509, the context cache control unit 507 selects this context data item. Alternatively, the context cache control unit 507 selects context data item which has been unused for the longest time or which has the smallest size. Alternatively, by using the two criterion for selecting the context data item to be deleted as described above, the context cache control unit 507 may select context data item which has been unused for more than a given time and whose size is less than a given size, for example. Further, the present invention is not limited to this selection method. Any method can be used for selecting the context data item to be deleted.

The context cache control unit 507 stores the context data item being selected described above in the context data storage unit 6 (step S106). The context cache control unit 507 then loads the context data item of the context identifier "C" into the area in which the context data item being stored has been stored (step S107).

Step S108: once the loading of the context data item is finished, the context cache control unit 507 notifies the context I/O control unit 505 of this.

The above procedure desirably causes contexts data items corresponding to the context identifiers stored in the first to fourth context identifier storage units 501 to 503 and 509 to be stored in the context cache 510. The context cache 510 thus desirably has a memory capacity sufficient to store at least four context data items.

Figure 14:
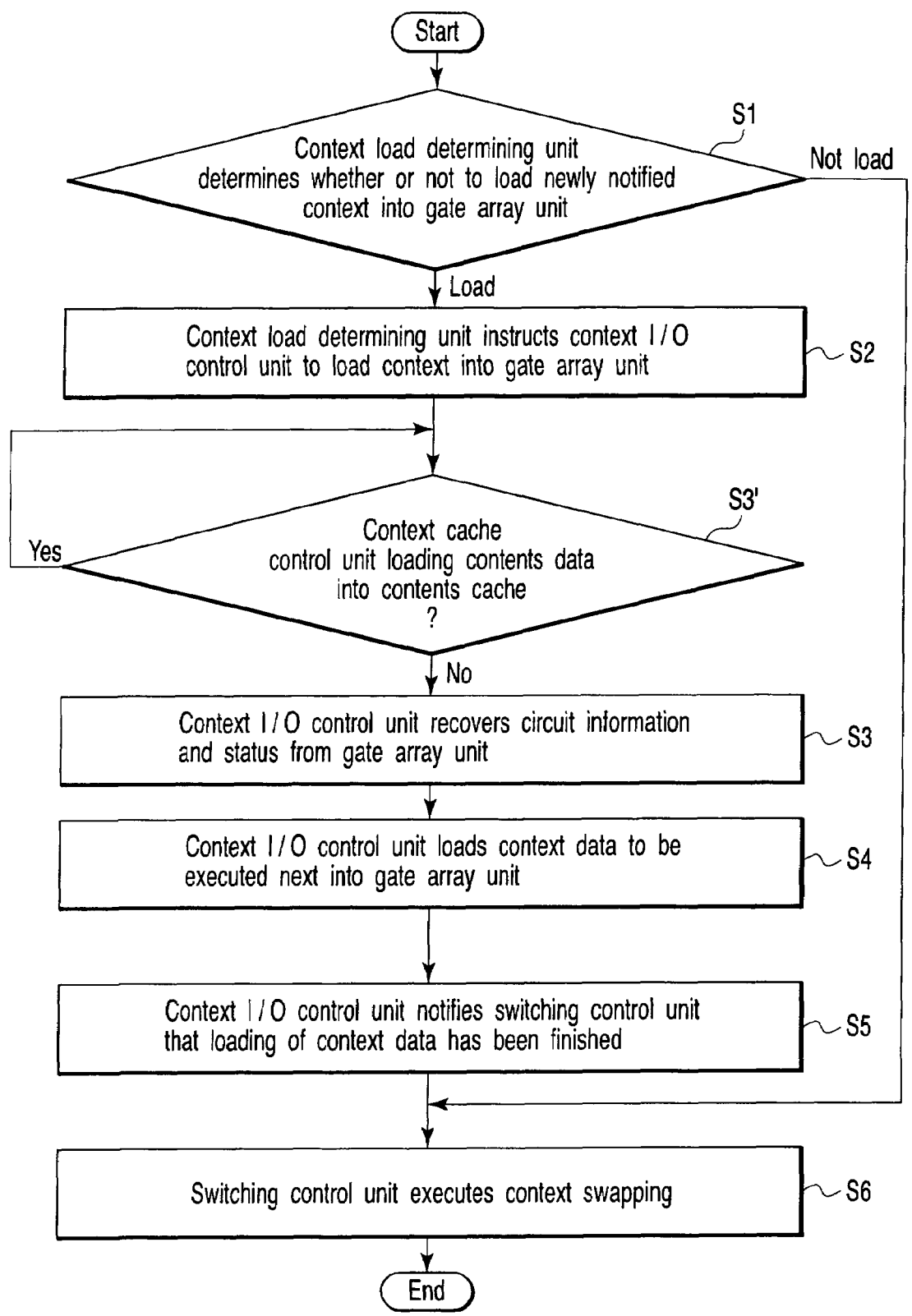
FIG. 14 is a flowchart illustrating processing operations of the context control unit in FIG. 12.

With reference to the flowchart shown in FIG. 14, description will be given of processing operations of the context load determining unit 504 and context I/O control unit 505. In FIG. 14, the same components as those in FIG. 11 are denoted by the same reference numerals.

Step S1: by the context swap exec signal, the context identifier stored in the second context identifier storage unit 501 is replaced with the context identifier stored in the third context identifier storage unit 503. The context load determining unit 504 compares the context identifier stored in the second context identifier storage unit 501 with the context identifier stored in the third context identifier storage unit 503 to determine whether or not to load, into the gate array unit 1, the context corresponding to the context identifier stored in the second context identifier storage unit 501.

When the context identifier stored in the second context identifier storage unit 501 matches the context identifier stored in the third context identifier storage unit 503, the context load determining unit 504 determines to load into the gate array unit 1, the context data item corresponding to the context identifier stored in the second context identifier storage unit 501, because the context data item is already stored (saved) in the context load shift register 11. In this case, the context load determining unit 504 notifies a context I/O control unit 505 that no context data item needs to be loaded into the gate array unit 1. The process then proceeds to step S6.

Step S2: when the context identifier stored in the second context identifier storage unit 501 does not match the context identifier stored in the third context identifier storage unit 503, the context load determining unit 504 determines to load the context corresponding to the context identifier stored in the second context identifier storage unit 501 into the gate array unit 1. The context load determining unit 504 then rewrites the context identifier stored in the third context identifier storage unit 503 with the context identifier currently stored in the second context identifier storage unit 501.

The context load determining unit 504 also instructs the context I/O control unit 505 to read from the context cache 510, the context data item corresponding to the context identifier stored in the second context identifier storage unit 501 and then to transfer the context data item to the gate array unit 1 (the context load determining unit 504 outputs a context load instruction).

Step S3': upon receiving the context load instruction from the context load determining unit 504, the context I/O control unit 505 outputs a notification that the context data item is being loaded, to the switching control unit 506. The context I/O control unit 505 waits for the context cache control unit 507 to finish loading the context data item into the context cache 510.

Step S3: once the context cache control unit 507 finishes loading the context data item into the context cache 510, the context I/O control unit 505 starts recovering the context data item corresponding to the context identifier stored in the third context identifier storage unit 503. That is, the context I/O control unit 505 starts recovering the circuit information item currently stored in the circuit information load shift register 111 and the status information item currently stored in the status load shift register 112. The context I/O control unit 505 stores the recovered circuit information item and status information item in a storage area in the context cache 510 which corresponds to the recovered context data item.

Step S4: the context I/O control unit 505 subsequently reads, from the context cache 510, the context data item (including the circuit information item and status information item) corresponding to the context identifier stored in the second context identifier storage unit 501. The context I/O control unit 505 then loads the context data item into the context load shift register 11 of the gate array unit 1.

If the gate array unit 1 is configured as described in the first and second embodiments, it is possible to simultaneously execute the loading of the context into the gate array unit 1 and the recovery of the status.

Step S5: once the loading of the context data item is finished, the context I/O control unit 505 outputs a notification indicating this, to the switching control unit 506.

Step S6: the switching control unit 506 receives a signal requesting context swapping (switching request signal), from the control unit of the apparatus including the gate array unit 1. While the context I/O control unit 505 is loading the context, the switching control unit 506 cannot execute context swapping and thus suspends execution of the context swapping. Subsequently, upon receiving, from the context I/O control unit 505, a notification that the loading of the context has been finished, the switching control unit 506 executes context swapping. That is, the switching control unit 506 outputs the context swap exec. signal to the gate array unit 1. If the switching control unit 506 receives the switching request signal after receiving, from the context I/O control unit 505, the notification that the loading of the context has been finished, it executes context swapping upon the reception of the switching request signal.

If a notification that the loading of the context data item is unnecessary is received in step S1, the switching control unit 506 executes context swapping upon the reception of the switching request signal.

As described above, the fourth embodiment can reduce the number of times that context data item is loaded into the gate array unit 1. This makes it possible to substantially reduce the time required to load the context data item into the gate array unit 1 by loading the context data item from the cache memory 510 into the gate array unit 1.

As described above, according to the first to the fourth embodiment, it is possible to substantially reduce the time required to switch the contexts while minimizing the number of storage elements inside the gate array.

What is claimed is:

1. A method for switching circuits of a programmable gate array apparatus including a plurality of macrocells connected in series, each of the macrocells including:
a first group of storage elements in which a first context data item of a plurality of the context data items is stored as an active context data item; and
a second group of storage elements corresponding to the storage elements of the first group respectively, in which a second context data item of the context data items is stored as an idle context data item; and
wherein each of the storage elements of the first and second groups is a flip flop circuit;
the method comprising:
inputting a load signal to the macrocells;

connecting the storage elements of the second group in series when the load signal is input by connecting a data output terminal of one of the storage elements of the second group to a data input terminal of another of the storage elements which succeeds the one of the storage elements, to connect the macrocells in series via the second group in the each of the macrocells;

inputting a clock signal to the macrocells;

inputting, to the macrocells, a third context data item which is one of the context data items and is to be active next to the active context data item;

loading, by using the clock signal, the third context data item into the second group whose storage elements are connected in series, to store the third context data item in the second group as an idle context data item;

inputting a swap signal to the macrocells;

connecting the storage elements of the first group to corresponding storage elements of the second group respectively when the swap signal is input, by connecting a data output terminal of one of the storage elements of the second group to a data input terminal of a corresponding storage element of the first group and connecting a data input terminal of the one of the storage elements of the second group to a data output terminal of the corresponding storage element of the first group;

swapping the one of the context data items stored in the first group and the subsequent context data item stored in the second group, to store the third context data item in the first group as the active context data item and to store the first context data item in the second group as the idle context data item.

2. The method according to claim 1, wherein the loading includes:
recovering, by using the clock signal, the second context data item stored in the second group whose storage elements are connected in series; and
loading, after recovering the second context data item, the third context data item into the second group.

3. The method according to claim 1, wherein each macrocell of the macrocells includes first and second connection points, the first connection point connecting the macrocell to a succeeding one of the macrocells which succeeds the macrocell and the second connection point connecting the macrocell to a preceding one of the macrocells which precedes the macrocell; and
wherein the loading includes:
connecting, to the first connection point, a data output terminal of a final storage element of the second group whose storage elements are connected in series, and connecting, to the second connection point, a data input terminal of an initial storage element of the second group whose storage elements are connected in series, to form a transfer line for loading the third context data item into the macrocells.

4. The method according to claim 1, wherein each macrocell of the macrocells further includes:
first and second connection points, the first connection point connecting the macrocell to a succeeding one of the macrocells which succeeds the macrocell and the second connection point connecting the macrocell to a preceding one of the macrocells which precedes the macrocell;
a control data storage element which stores a bypass control data item indicating whether or not to use the macrocell; and wherein loading includes:
connecting, to the first connection point, either the second connection point or the data output terminal of the final storage element based on the bypass control data item.

5. The method according to claim 4, wherein the connecting to the first connection point connects the data output terminal of the final storage element to the first connection point when the bypass control data item indicates use of the macrocell, and connects the second connection point to the first connection point when the bypass control data item indicates nonuse of the macrocell.

6. The method according to claim 1, wherein each macrocell of the macrocells includes:
first and second connection points, the first connection point connecting the macrocell to a succeeding one of the macrocells which succeeds the macrocell and the second connection point connecting the macrocell to a preceding one of the macrocells which precedes the macrocell;
a first control data storage element which stores a first bypass control data item indicating whether or not the macrocell is being used for the active context data item; and
a second control data storage element which stores a second bypass control data item indicating whether or not the macrocell is used for the third context data item which is to be active next to the active context data item; and
wherein loading includes:
connecting, to the first connection point, either the second connection point or the data output terminal of the final storage element, based on the second bypass control data item stored in the second control data storage element;
and wherein the swapping includes:
swapping the first bypass control data item stored in the first control data storage element and the second bypass control data item stored in the second control data storage element, to store the first bypass control data item in the second control data storage element and to store the second bypass control data item in the first control data storage element.

7. The method according to claim 1, further comprising:
storing, in a first memory, a first identifier corresponding to the idle context data item;
storing, in a second memory, a second identifier corresponding to a first subsequent context data item which is one of the context data items and is to be active next to the active context data item; and
wherein the inputting the third context data item to the macrocells inputs the third context data item whose identifier is the second identifier and is different from the first identifier.

8. The method according to claim 7, further comprising:
storing, in a cache memory, a part of the context data items, the part including the active context data item and the idle context data item, and a necessary context data item which is one of the context data items other than the part and is to be active; and
wherein inputting the third context data item inputs the third context data item which is stored in the cache memory as the necessary context data item and is read from the cache memory.

* * * * *